United States Patent
Deppe et al.

(10) Patent No.: US 7,259,363 B2
(45) Date of Patent: Aug. 21, 2007

(54) CIRCUIT ARRANGEMENT AND METHODS FOR A REMOTE CONTROL RECEIVER HAVING A PHOTODIODE

(75) Inventors: Carsten Deppe, Aachen (DE); Thomas Dürbaum, Baiersdorf (DE); Georg Sauerländer, Aachen (DE)

(73) Assignee: Koninklijke Philips Electronics N.V., Eindhoven (NL)

( * ) Notice: Subject to any disclaimer, the term of this patent is extended or adjusted under 35 U.S.C. 154(b) by 5 days.

(21) Appl. No.: 10/541,980

(22) PCT Filed: Dec. 15, 2003

(86) PCT No.: PCT/IB03/06279

§ 371 (c)(1),
(2), (4) Date: Jul. 11, 2005

(87) PCT Pub. No.: WO2004/064005

PCT Pub. Date: Jul. 29, 2004

(65) Prior Publication Data

US 2006/0127095 A1    Jun. 15, 2006

(30) Foreign Application Priority Data

Jan. 14, 2003    (EP) .................................. 03100052

(51) Int. Cl.
*G01J 1/44* (2006.01)
*H03F 3/08* (2006.01)
*H01L 31/00* (2006.01)

(52) U.S. Cl. ............................. 250/214 R; 250/214 A; 327/514

(58) Field of Classification Search ............ 250/208.2, 250/214 R, 214 A, 214 SW; 327/514, 515; 398/207, 146

See application file for complete search history.

(56) References Cited

U.S. PATENT DOCUMENTS

| 4,805,236 A | * | 2/1989 | Urala | ........................ | 398/202 |
| 5,889,605 A | * | 3/1999 | Claverie et al. | ............ | 398/202 |

FOREIGN PATENT DOCUMENTS

| DE | 3540677 C1 | 12/1986 |
| DE | 44 31 117 A1 | 3/1996 |
| EP | 0680144 A1 | 11/1995 |
| EP | 0632941 B1 | 1/1998 |
| EP | 0817353 A1 | 1/1998 |
| JP | 61023426 A | 1/1986 |
| WO | 9319539 A1 | 9/1993 |

* cited by examiner

*Primary Examiner*—Georgia Epps
*Assistant Examiner*—Don Williams

(57) ABSTRACT

A control unit (2) of a remote control receiver sets the forward or reverse direction operating mode of the photodiode (1) as a function of the useful signal level of its output signal, and to be precise, during standby, the photovoltaic operating mode (forward mode), since in this mode no external bias current is required. If the useful signal level of the photodiode (1) exceeds a predefined threshold, the reverse mode is set, and this brings with it a higher sensitivity. A series circuit (A) of a number of identical photodiodes DA1 DAn the forward mode allows the realization of a controlled current source (6) having a transistor (T), since the permissible diode voltage (Ud) of the overall arrangement may have n times the value of the operating voltage of an individual photodiode. Thus at the same time the voltage across the individual diodes can be set to a very low value and a favorable operating range for the current source can be set. The possible sensitivity of the receiver module having diodes in this operating mode can thereby be considerably increased.

20 Claims, 5 Drawing Sheets

CIRCUIT ARRANGEMENT AND METHODS FOR A REMOTE CONTROL RECEIVER HAVING A PHOTODIODE

The invention relates to a circuit arrangement for a remote control receiver having at least one photodiode as light receiver, which is assigned to a battery-operated, possibly portable device and/or to a device which draws its electrical power from the mains. The standby of the remote control receiver in this case leads to discharging of the battery and thus to a usability of the battery which is strictly limited in terms of time, or to increased operating costs on account of a constant consumption of power from the mains, even when the device is not actually operating.

The light signals that are to be received by the photodiode are based, for example, on infrared technology and may be remote control signals or data. Modules in which a corresponding photodiode with amplifiers, filters and amplifier control loops connected downstream is integrated are usually used for the reception. At the output, the receiver module delivers a binary signal which is directly connected to the device controller or to a decoder module. Only a low current is consumed for the decoding itself. In known remote control receivers, the controller or decoder module is deactivated during standby and always only switched to the active mode for a short time by received signals. On average, only a very low current <5 µA is consumed. The current consumption of the remote control receiver when the controller or decoder module is deactivated is therefore essentially determined by the receiver module. The receiver must detect very small signals (about 0.5 mW/m$^2$). In order to obtain a sufficient sensitivity, a minimum diode area is thus prescribed as a function of the selected topology. In the conventional topology, this area and the associated sensitivity lead to an unavoidable consumption of current as soon as extraneous light (e.g. sunlight, artificial light) or signals from other infrared sources (e.g. other remote control signals) reach the photodiode. In receiver modules that are conventional today, the ambient light, that is to say extraneous light or remote control signals from other sources, depending on its light intensity, provokes a consumption of current of up to four times the current that is consumed during active remote control, that is to say during reception of a remote control signal from the associated transmitter. There is therefore a dependence of the current consumption on the lighting conditions, and this in particular hinders all efforts to obtain a ether reduction in consumption.

DE 44 31 117 A1 relates to a circuit for receiving a light signal comprising alternating light and discloses the regulation of a photodiode current which leads to almost no current having to be taken from the power supply or battery. Since, in the region of the saturation voltage of a photodiode, a further increase in the illumination intensity leads to no further increase in voltage, the voltage across the photodiode must be kept to a value below the saturation voltage. According to the disclosure therein, this is done by virtue of a load resistor which consumes so much current that the voltage across the photodiode is, for example, always half the saturation voltage. No external voltage is thus required, but the resistor must be continually adapted to the light intensity. At half the saturation voltage, an alternating light component will always be able to bring about a change in voltage across the resistor. However, a stronger ambient light leads to a reduced resistance, which in turn reduces the amplitude of the useful signal (and therefore the sensitivity).

DE 44 31 117 A1 discloses a number of examples of embodiments of circuits in which a controllable resistor is connected in parallel with a photodiode. In one example of embodiment, a field effect transistor is connected in parallel with the photodiode, which photodiode is exposed to light. Via an operation amplifier, the photodiode voltage is continually compared with a reference voltage and adjusted by means of the field effect transistor. The field effect transistor in this case operates as a variable resistor. The advantages of this circuit are that only one photodiode is required and in addition the control is very precise. However, in all examples of embodiments it is disadvantageous that, on account of the use of the variable, controlled resistor in the circuits described in DE 44 31 117 A1, the useful sensitivity varies greatly with the constant light portion.

The voltage across the photodiode should be below the saturation voltage, for example half the saturation voltage. However, the capacitance of the photodiodes in the photovoltaic mode leads to an insufficient sensitivity with respect to changes in the incident light intensity, that is to say also with respect to a remote control signal. All embodiments described therein have the common feature that the photodiode is statically loaded without current being taken from the power supply to an appreciable extent. The photodiode is operated photovoltaically and is highly resistive without illumination.

EP 817 353 A2/A3 describes an apparatus for reducing the standby power of an electrical device that can be operated by remote control, which device has a receiver circuit having at least one photodiode for receiving the pulsed light signals emitted by the remote control, a resistor circuit, connected in parallel with the photodiode, for compensating for constant light signals, and a mains connection for a supply voltage. The resistor circuit comprises a self-regulating transistor as resistor, which as a function of the voltage changes its resistance as soon as a predefined voltage below the saturation voltage of the photodiode is exceeded, and loads the photodiode by the voltage-dependent resistance until the predefined voltage is substantially reached. It is specified that the voltage across the photodiodes should lie below the saturation voltage. However, on account of the capacitance of the photovoltaically operated photodiodes and the loading by a resistance, the sensitivity with respect to changes in the light intensity is not sufficient.

It is therefore an object of the invention to specify a circuit arrangement for a remote control receiver having a photodiode as light receiver, which circuit arrangement, with sufficient sensitivity, leads to a lower current consumption during standby. Another object is to specify a method of operating a remote control receiver having at least one photodiode.

In the conventional configuration, the receiving diode is operated in the high-resistance direction, where the flowing current is proportional to the radiant intensity. The sensitivity of the arrangement is great since a very small capacitance is set in the photodiode by the negative voltage. The disadvantage of this mode of operating the receiving diode in the reverse direction is that, given the incidence of extraneous light, a quiescent current flows which has to be taken from the voltage supply.

If an IR receiving diode is operated in the forward direction, in the photovoltaic mode, a voltage can be measured at the diode. Loading of this voltage likewise produces a current flow which is proportional to the incident radiation. The value of this current is practically identical to that in the reverse direction, but the essential disadvantage of the operation of the IR diode in the forward direction is that the receiving diode in this operating range has a substantially higher self-capacitance. Together with the effective resistance of the external wiring(?), the self-capacitance forms a low-pass filter which represents additional damping for the (high-frequency) useful signal. As a result, there is a reduced sensitivity in the photovoltaic mode.

A first refinement of the invention is based on the knowledge that both operating modes of a photodiode, both the reverse direction and the photovoltaic mode, have advantages and combines these operating modes in a suitable manner such that, with sufficient sensitivity, at the same time a low fault liability and an improved current consumption are obtained.

A second refinement of the invention is based on the knowledge that, in a series circuit of a number of identical photodiodes, the voltage across the diode series circuit increases but the capacitance of the individual diodes decreases. A low capacitance in turn increases the sensitivity of the system. It can be seen that a gain can be achieved on account of the nonlinear properties of the components used.

According to a first refinement of the invention, the object is achieved by a circuit arrangement for a remote control receiver having at least one photodiode for receiving a light signal and generating an output signal, where the photodiode can be operated in the forward direction operating mode or in the reverse direction operating mode and the remote control receiver has a control unit for setting the operating modes of the photodiode.

The control unit has in each case one controlled current source for setting one of the two operating modes of the photodiode. The two current sources are controlled by a controller as a function of the signal level or useful signal level of the output signal of the photodiode such that in each case one of the two operating directions of the photodiode is selected. The signal level of the output signal is in this case a measure of the situation of the photodiode. If, for example, a pulsed light signal is received, the photodiode generates a likewise pulsed electrical output signal and is switched by the controller into the reverse mode in order that the sensitivity is sufficient to receive signals with as little loss as possible. If, for example, a light signal from a source of interference (e.g. sunlight) is received, the photodiode generates a rather static output signal and is switched by the controller into the forward mode (photovoltaic mode) in order that the power consumption is as low as possible for as long as no usable light signal is received and thus has no bearing on the sensitivity.

The minus pole of the first current source is connected to the cathode of the photodiode and the plus pole of the second current source is connected to the anode. Both operating modes can be obtained by suitable actuation of the two current sources.

The object is also achieved according to the invention by a method of operating a remote control receiver having at least one photodiode for receiving a light signal and generating an output signal, where the photodiode is operated in the forward direction operating mode or in the reverse direction operating mode and a control unit sets the operating mode of the photodiode as a function of the signal level or useful signal level of its output signal. The advantages of both operating modes, on the one hand the high sensitivity in the reverse mode and on the other hand the low power consumption in the forward mode, are therefore combined.

The diode current comprises a direct current portion (DC) and an alternating current portion (AC). During standby, the photodiode is operated in the forward direction operating mode, the first current source is set to zero (and thus acts as an opened switch) and the second current source is set such that the DC voltage lies between about 5 and about 500 mV, that is to say below the saturation voltage of about 500 mV. Preferably, the DC voltage lies below 200 mV. For this purpose, the DC voltage is supplied via an amplifier of the control unit, which then adjusts the second current source as a function of the measured constant light portion.

The AC output signal generated by the photodiode is also evaluated by the controller. For this purpose, the output of the AC amplifier stage (transimpedance amplifier) is connected to the controller. If the level of the AC output signal exceeds a predefined threshold, then the controller triggers a changeover of the operating mode to the reverse direction: the second current source is set to maximum and thus forms a closed switch, and the first current source is activated, with the value of the first current source being set such that the DC voltage is about half the operating voltage of the remote control receiver. This is in turn measured via the amplifier since the current in the forward direction and reverse direction is approximately the same, and, by virtue of a suitable starting value of the current in the first current source (e.g. equal to the last value of the second current source), response times of the changeover operation can be kept to a minimum.

If the controller detects that the end of the received infrared signal has been reached, that is to say for example the AC amplitude of the sensor signal again falls below a defined value and stays there (short time delay since conventional remote control codes contain pauses), it again triggers the changeover of the operating mode to the forward mode of the IR diode.

During operation of the photodiode in the forward direction, the sensitivity of the reception stage is reduced on account of the capacitance of the photodiode(s). Given a sufficiently strong received level of the remote control signal, for example if the remote control transmitter is close to the receiving diode, the reduced sensitivity in the photovoltaic mode is also sufficient for decoding. This means that in a refinement of the invention the current consumption can be further reduced by a further switching threshold being provided, which switching threshold relates to the received level of the AC light signal and switches the receiving diode to the reverse mode only when this further switching threshold is undershot. The reverse mode is thus only used when the lower switching threshold is smaller than the AC light signal and the latter is in turn smaller than the upper switching threshold, that is to say that the reverse mode is set when: (lower switching threshold)<(AC light signal)<(upper switching threshold).

The invention is also achieved by a circuit arrangement for a remote control receiver which has at least one photodiode for receiving a light signal and generating an output signal, where a number of photodiodes having the same polarization are arranged as a series circuit and a controlled current source for generating the bias current of the at least one photodiode is connected in parallel with the diode series circuit. The optimal voltage for an individual receiving diode is below about 150 mV. In order to prevent a current consumption from the supply voltage source, it must be ensured that the current flows directly back into the diode, that is to say not via the supplying voltage source. The design of the current source is simplified on account of the increased permissible voltage across the diode series circuit.

A very simple and preferred embodiment of the controlled current source is a transistor having an emitter resistor: a bipolar transistor as current regulator and a junction field effect transistor JFET as controllable resistor of the controlled current source. The effective internal resistance of the current source then corresponds to the value of the resistance multiplied by the amplification of the transistor. A minimum collector/emitter voltage is necessary in order to be able to operate a (real) transistor as current source. In the event of a collector/emitter voltage that is too low, the transistor increasingly responds in a way which is not ideal, that is to say it no longer allows any amplification. As a result, the loading for the useful light signal increases and the required sensitivity cannot be ensured. In the solution according to the invention, the transistor is arranged such that the voltage of the series circuit of the photodiodes corresponds to the collector/emitter voltage of the transistor, with a controllable resistor being arranged in the emitter path. Together with the constant voltage at the base of the transistor, this arrangement forms the desired current source, where the "quality" of the current source, obtained by an internal resistance that is as high as possible, depends on the amplification of the transistor and on the set emitter resistance. The more photodiodes contained in the series circuit, the lower the voltage across the individual diodes, as a result of which the effective capacitance of each individual photodiode is reduced. At the same time, the collector/emitter voltage across the transistor and the voltage across the resistor (and thus in turn the necessary resistance value) can be increased even in the case of a relatively small diode voltage.

In a preferred embodiment, the series circuit of the photodiodes is obtained by splitting the diode area by means of structuring on the chip or wafer. As a result, the silicon area is kept as small as possible and at the same time the diodes are very precisely identical, which means that the voltage is distributed as uniformly as possible over all of them.

In a preferred method according to the invention for operating a remote control receiver, a number of identical photodiodes, arranged as a series circuit, are operated in the forward direction and, when there is incident light, generate a photocurrent. In this case, the AC portion of the photocurrent is decoupled by a transimpedance amplifier. The forward voltage across each receiving diode is kept to a DC value that is as small as possible by means of the controlled current source. In infrared receivers, usually the constant portion of the sensor current is compensated by a separate current source in order to prevent ambient light or extraneous light from saturating the input amplifier. This is necessary since the infrared useful signals may be smaller than the interference signals by a few orders of magnitude.

As an example of the possible gain, the comparison between the use of a photodiode and the splitting of its chip area into n individual diodes is to be assessed here. The voltage across the individual diodes is in each case kept constant. In a circuit having an n-fold series circuit of the photodiodes, compared to the prior art with one photodiode, the photocurrent is reduced to 1/n of the original value and at the same time the resulting capacitance is likewise reduced to the factor $1/n^2$ (1/n by the series circuit of the part-diodes and 1/n by the part-capacitances of the smaller diode areas). The effective input resistance of the transimpedance amplifier determines, together with this capacitance, the limit frequency of the circuit. In order to obtain an identical limit frequency, this resistance can now be increased to $n^2$-times the value. As a result, the current reduced to 1/n can be further amplified by the factor $n^2$ so that there is a gain by the factor n. On the other hand, there is now an n-times higher voltage available to the current source. While at very low voltages only a current source with a lesser value can be designed, the increased voltage allows a greater gain in sensitivity. Example calculations show, at a transition from n=1 to n=6, a gain of around 100 for the current source; the overall gain is then n*100=600.

A combination of the two refinements of the invention and their variants is likewise possible.

By the inventive connection of the photodiodes to the amplifier, a large reduction in the current consumption is obtained since no bias current is necessary.

The invention will be further described with reference to examples of embodiments shown in the drawings to which, however, the invention is not restricted.

FIG. 1 shows a basic circuit of a first refinement of a remote control receiver according to the invention.

FIG. 2a) shows the current flow in the forward direction operating mode.

FIG. 2b) shows the current flow in the reverse direction operating mode.

Figure 1:
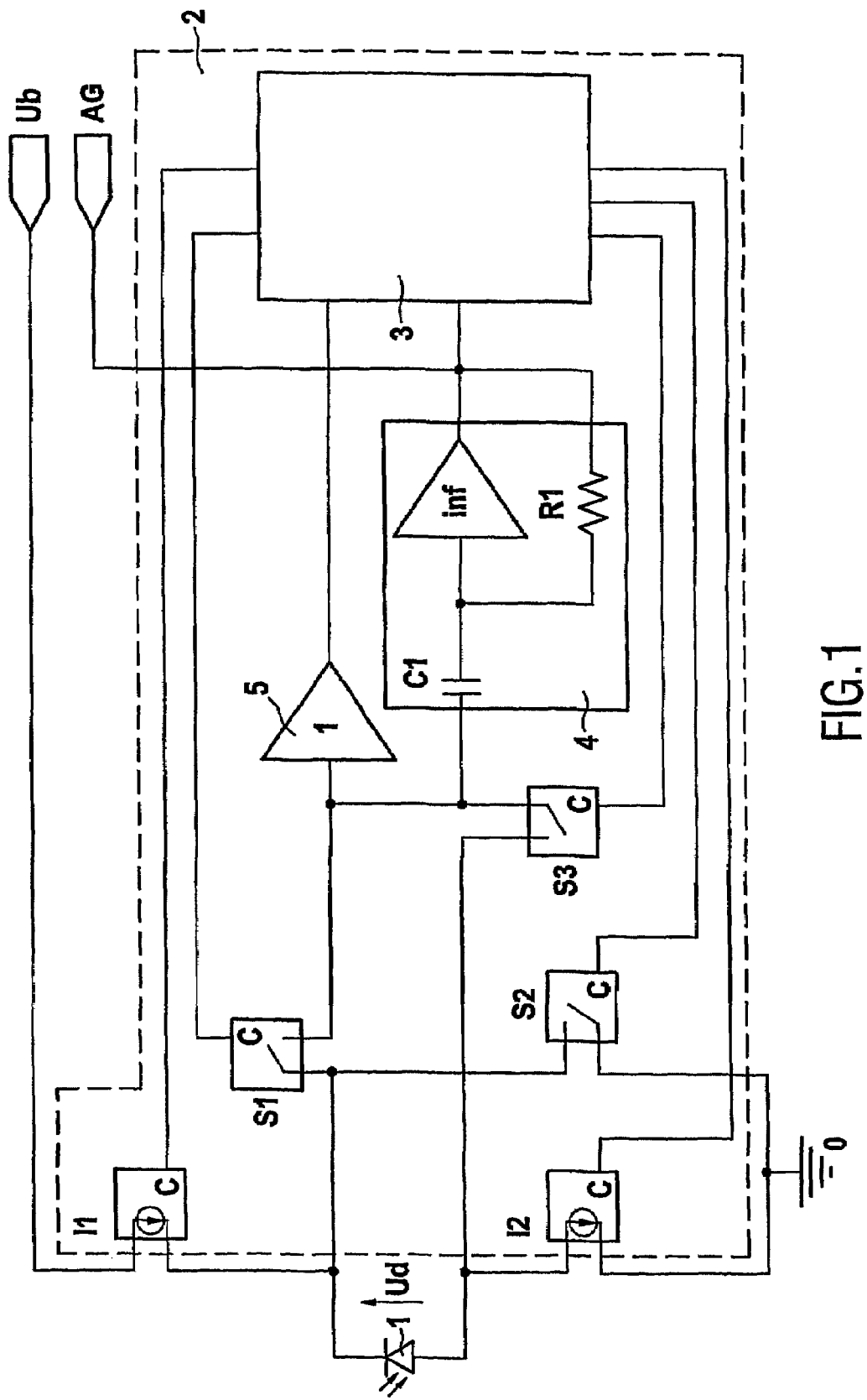

FIG. 1 shows a basic circuit of a first refinement of a remote control receiver according to the invention. A control circuit 2 for setting the operating mode is arranged in parallel with the photodiode 1 for receiving a (pulsed) light signal LS. The control circuit 2 comprises a first current source I1, to which the photodiode 1 is connected by way of its cathode, and a second current source I2, to which said photodiode 1 is connected by way of its anode. Both current sources I1 and I2 are controlled by a controller 3. A first switch S1 connects the cathode of the photodiode 1 to the signal amplifiers 4 and 5. A second switch S2 switches the cathode to ground when required. A third switch S3 connects the anode to the signal amplifiers 4 and 5. All three switches S1, S2 and S3 are controlled by the controller 3. The operating mode of the photodiode 1 is changed over to the forward direction or the reverse direction as a function of the output signal of the photodiode 1. These two operating directions are obtained by controlling the switches S1 to S3 and the current sources I1 and I2. For this, the controller 3 evaluates the AC sensor signal and the DC voltage level of the output signal of the photodiode 1 in order to determine whether the photodiode 1 is switched into the standby mode (forward direction) or into the active mode (reverse direction). The diode voltage Ud is present across the photodiode 1. The remote control receiver has an operating voltage Ub and an output signal AG.

Figure 2A:
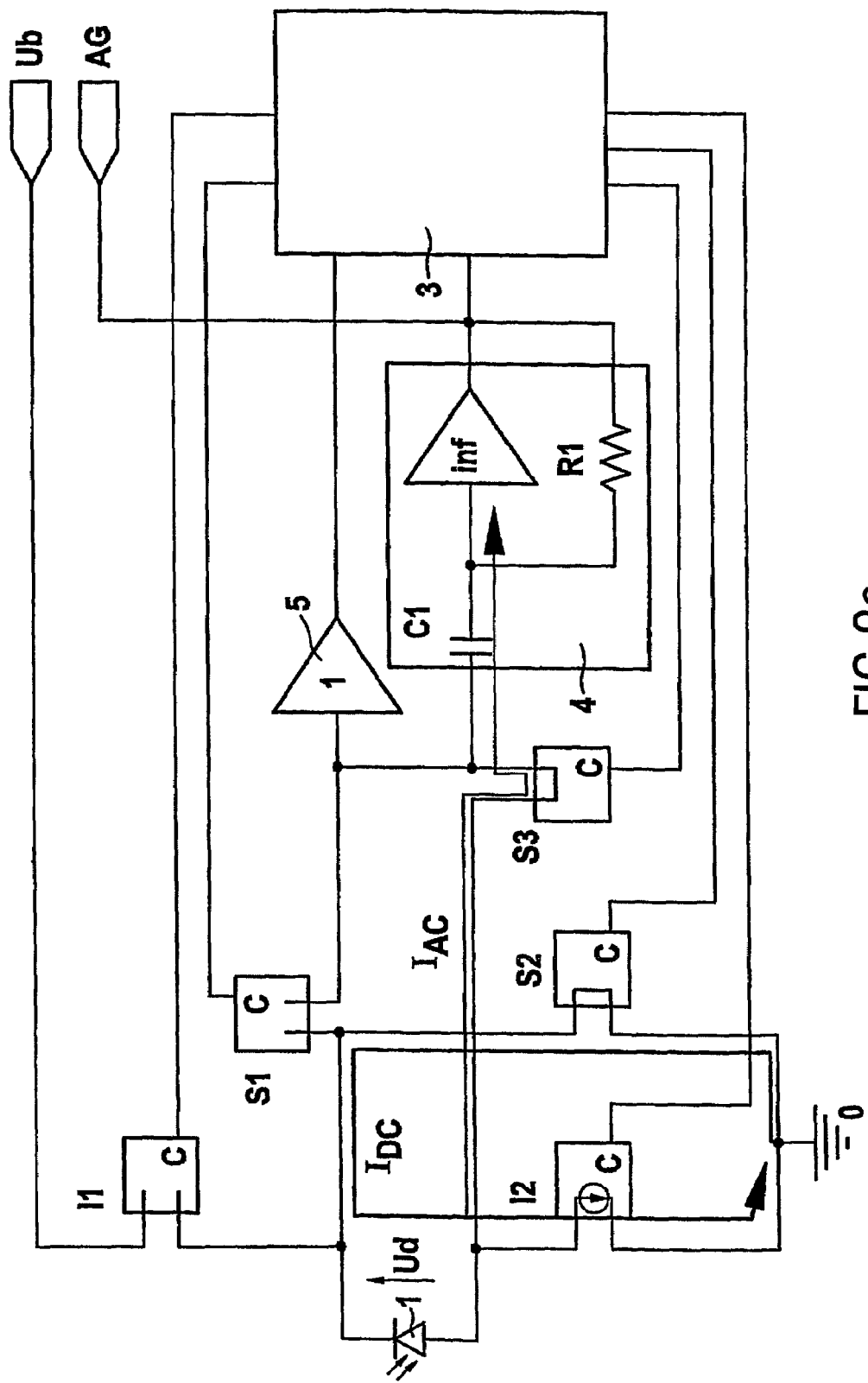

FIG. 2a) shows the current flow in the forward direction operating mode. During standby, the two switches S2 and S3 are closed and the controller 3 controls the current source I2 such that the DC voltage lies below the saturation voltage of the photodiode 1. Taking into account the diode capacitance, values of below about 200 mV are to be preferred. The switch S1 is opened and the first current source I1 is set to zero. The output signal of the photodiode 1 is passed at the anode via the switch S3 and an AC amplifier stage 4 (transimpedance amplifier=current/voltage converter) and a DC amplifier stage 5 (voltage follower with amplification 1 for the decoupling) to the controller 3 and/or the output AG.

Figure 2B:
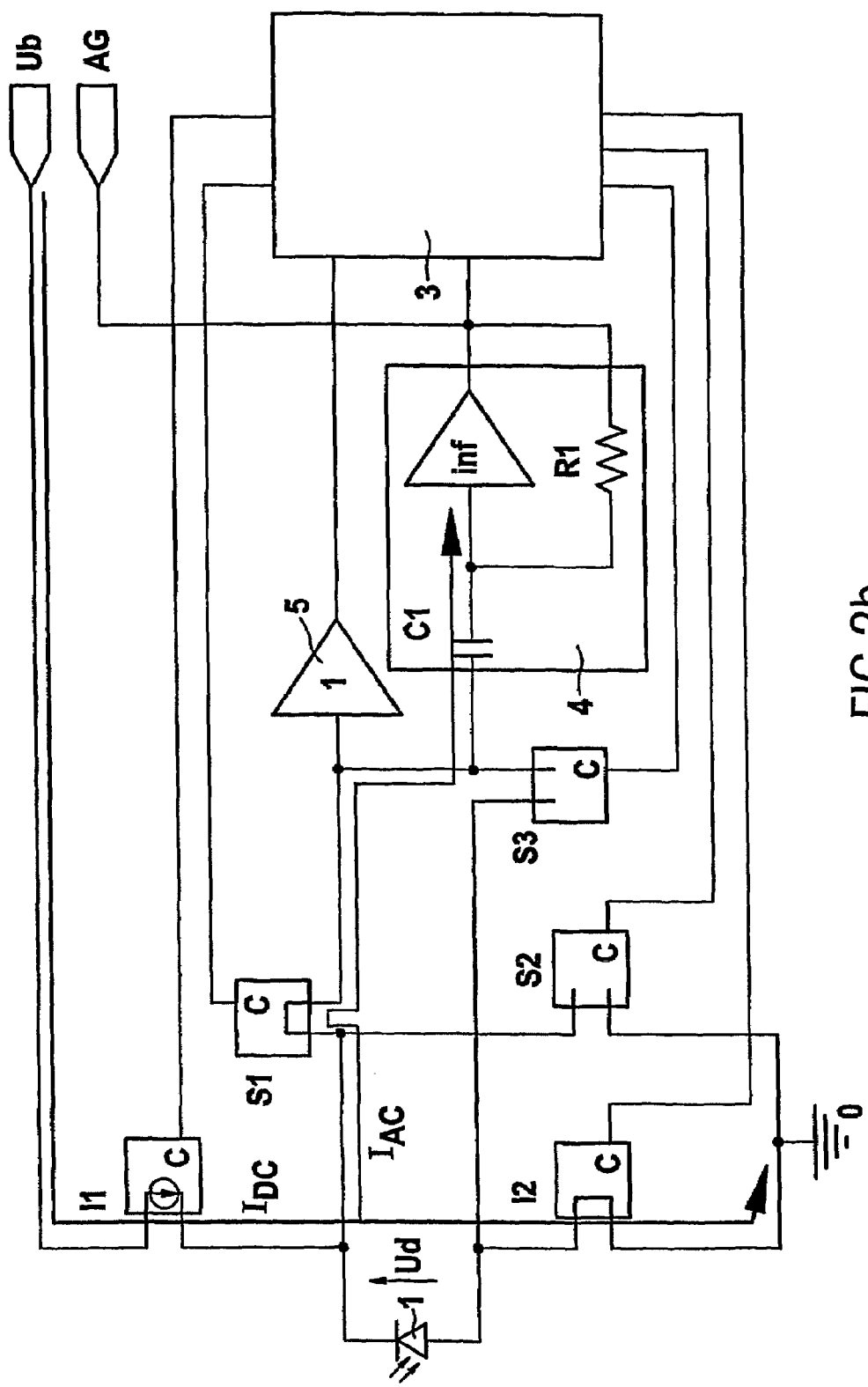

FIG. 2b) shows the current flow in the reverse direction operating mode: if the level of the AC diode output signal exceeds a predetermined threshold, then operation is changed over to the active mode. The switch S1 is closed and the switches S2 and S3 are opened. The current source I2 is set to maximum or at least to a higher value than in the forward direction operating mode, in order that it forms a closed switch, while the current source I1 is activated and set such that the DC voltage is about half the operating voltage Ub. The photodiode 1 is thus operated in the reverse direction. If the evaluation by the controller 3 determines the end of the received signals, that is to say the amplitude of the useful signal of the photodiode 1 falls below a minimum value for a time that is longer than the maximum pause interval of the transmission code used, the receiver is again switched into the standby mode, i.e. into the photovoltaic mode.

Figure 3:
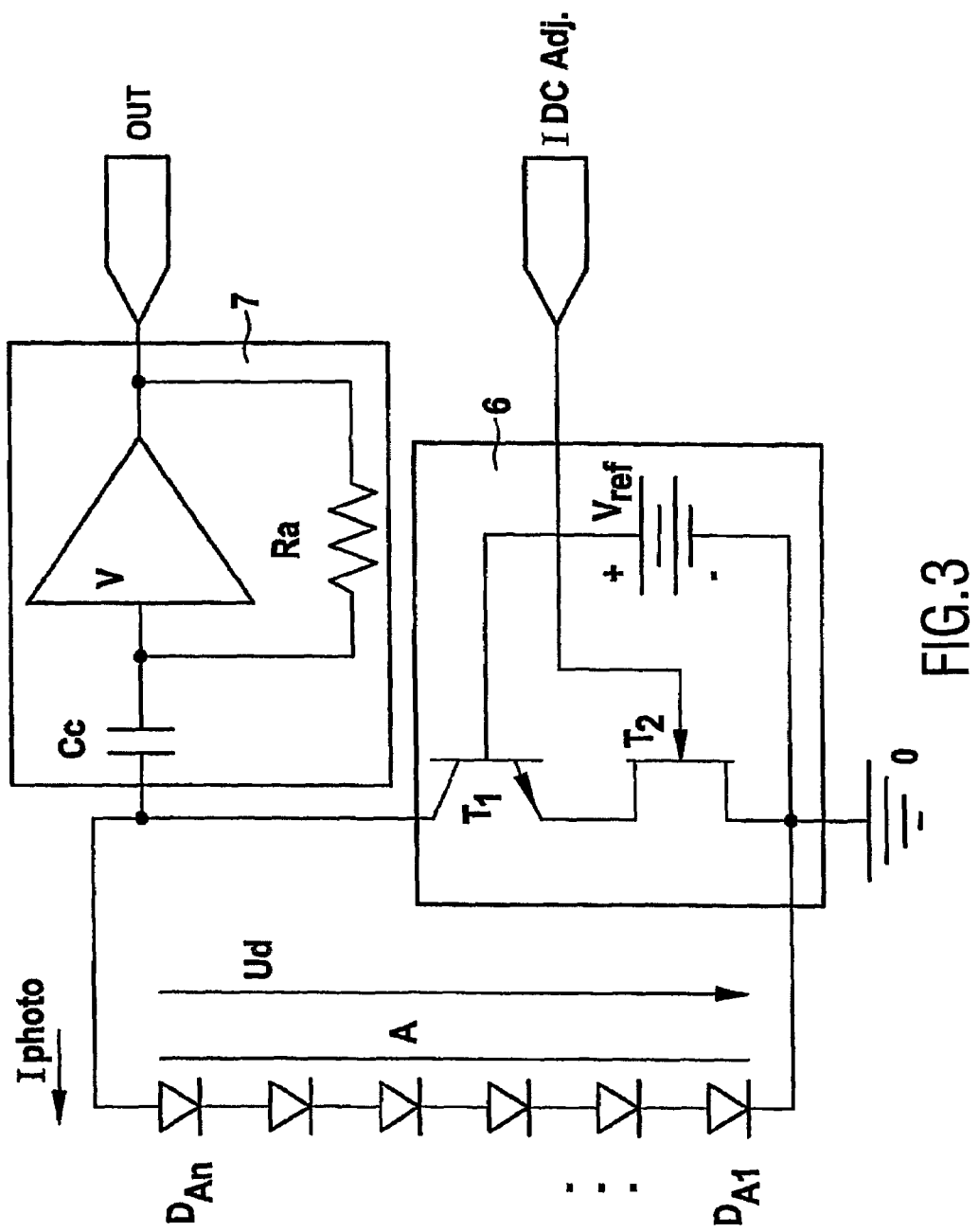
FIG. 3 shows a basic circuit diagram of a second refinement of a remote control receiver according to the invention.

FIG. 3 shows a basic circuit diagram of a second refinement of the remote control receiver according to the invention, which has a series circuit A of a number of photodiodes $D_{A1} \ldots D_{An}$ across which the diode voltage Ud is present. Incident light generates a photocurrent $I_{photo}$. A transistor T1 is connected in parallel with the series circuit A as part of a controlled current source 6. The transistor T1 forms, together with the controllable resistor in the emitter path—in this example of embodiment the controllable resistor is formed by a JFET T2—and the voltage source $V_{ref}$, a controlled current source 6. The resistance value of the JFET T2 is set by the control input I DC Adj. The transistor T1 then acts as a current regulator. The AC portion of the photocurrent $I_{photo}$ is decoupled by a transimpedance amplifier 7. The transistor T1 requires a certain minimum voltage Ud in order to be able to operate as current source. As a result of the fact that n photodiodes form the series circuit A, only the voltage Ud/n is present across the individual photodiodes, as a result of which the effective capacitance of the individual photodiodes becomes smaller as n becomes greater.

Figure 4:
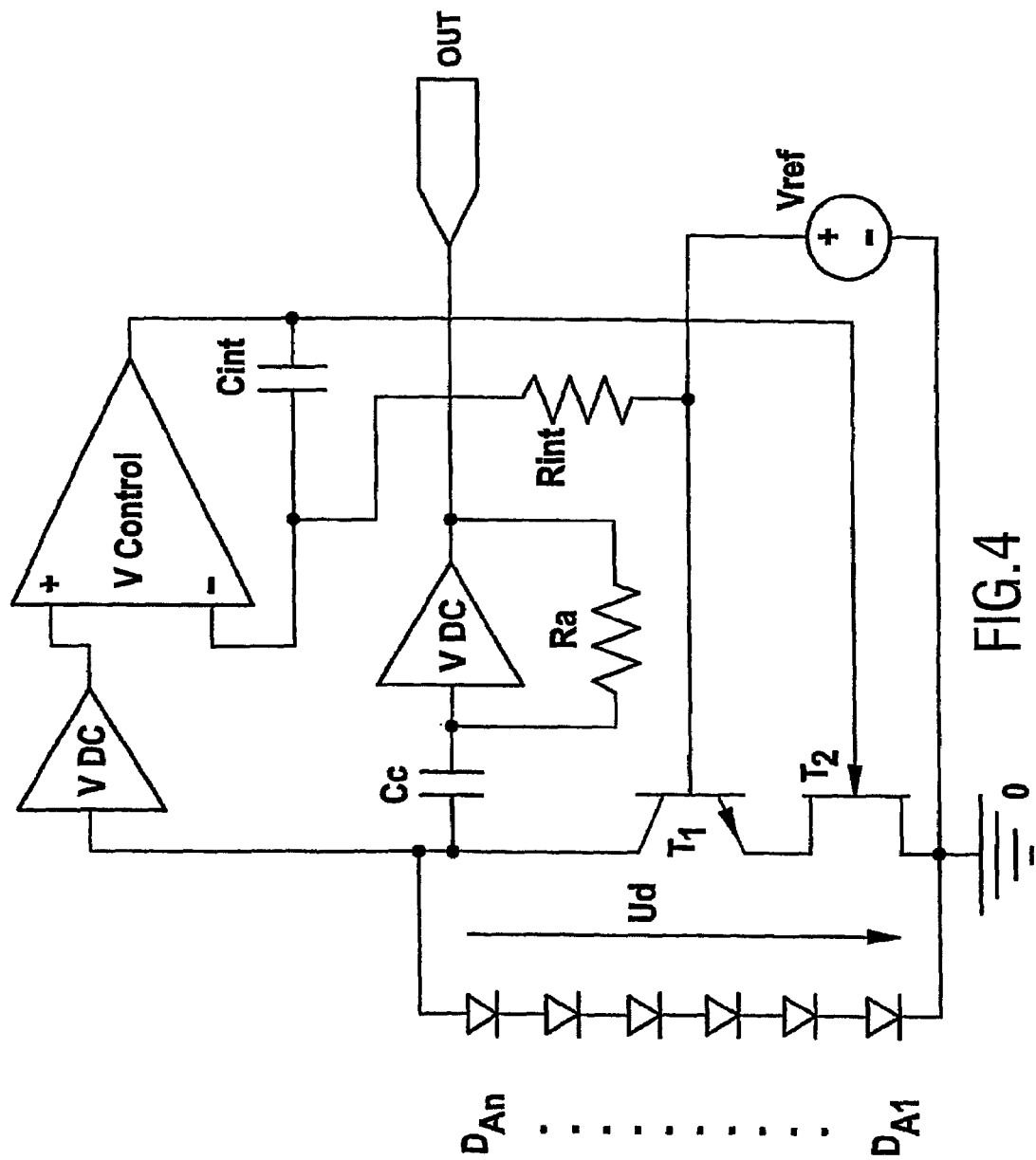
FIG. 4 shows a further basic circuit diagram of the second refinement of the invention.

FIG. 4 shows a further basic circuit diagram of the second refinement of the invention, specifically a circuit that is almost complete. The reference voltage $V_{ref}$ is, for example, 0.9 V. The voltage across the photodiodes $D_{A1}$ to $D_{An}$ is tapped off and decoupled via V DC. V Control compares this voltage with the reference voltage $V_{ref}$. If it is too great, the gate voltage of the JFET T2 is increased; $R_{int}$ and $C_{int}$ then act as filters for the signal portions of higher frequency. By increasing the gate voltage, the resistance of the JFET T2 decreases, the current of the current source increases and the voltage across the photodiode is kept constant at the reference level. If the reference level of 0.9 V is also used for the base of the transistor T1, at the same time it is set in this case too to approximately the desired voltage distribution. Since the basis emitter voltage is set to about 0.6 . . . 0.7 V, there is a voltage of about 0.2 . . . 0.3 V at the JFET T2.

The invention claimed is:

1. A circuit arrangement for a remote control receiver comprising:
   at least one photodiode that is configured to receive a light signal and generate an output signal that includes an AC component and a DC component, and
   a control unit that is configured to control the photodiode to operate in a forward direction operating mode or in a reverse direction operating mode, based on the AC component.

2. The circuit arrangement of claim 1, wherein the control unit includes controlled current sources that are configured to selectively provide the operating modes of the photodiode.

3. The circuit arrangement of claim 2, wherein a negative pole of a first current source is connected to a cathode of the photodiode and a positive pole of a second current source is connected to an anode of the photodiode.

4. The circuit arrangement of claim 1, wherein a negative pole of a first current source is connected to a cathode of the photodiode and a positive pole of a second current source is connected to an anode of the photodiode.

5. The circuit arrangement of claim 1, further comprising a transimpedance amplifier that is configured to detect the AC component.

6. A method of operating a remote control receiver having at least one photodiode for receiving a light signal and generating an output signal, comprising:
   receiving an AC component of the output signal,
   selectively operating the photodiode in a forward direction operating mode or in a reverse direction operating mode based on the AC component.

7. The method of claim 6, including
   providing a first current during the forward direction operating mode of the photodiode such that a DC voltage across the photodiode lies below its saturation voltage.

8. The method of claim 7, wherein the reverse direction operating mode of the photodiode is set when the AC component exceeds a predefined threshold, by providing a second current at a higher value than in the forward direction operating mode, and providing the first current such that the DC voltage across the photodiode is approximately half an operating voltage of the remote control receiver.

9. The method of claim 7, wherein the first current is provided such that the DC voltage across the photodiode is below 200 millivolts.

10. The method of claim 7, wherein the forward direction operating mode for the photodiode is set when the AC component drops below a threshold.

11. The method of claim 6, including
    setting the forward direction operating mode for the photodiode when the AC component drops below a threshold.

12. A method of operating a remote control receiver having at least one photodiode for receiving a light signal and generating an output signal, comprising:
    operating the photodiode in a forward direction operating mode or in a reverse direction operating mode,
    setting the operating mode of the photodiode as a function of signal level or useful signal level of its output signal,
    setting the reverse direction operating mode of the photodiode when a signal level or useful signal level of the photodiode exceeds a predefined threshold, by providing a first current at a higher value than in the forward direction operating mode, and
    providing a second current such that a DC voltage across the photodiode is about half an operating voltage of the remote control receiver.

13. The method of claim 12, wherein the forward direction operating mode for the photodiode is set when the useful signal level drops below a threshold level.

14. The method of claim 12, wherein the second current is provided during the forward direction operating mode of the photodiode such that the DC voltage across the photodiode lies below its saturation voltage.

15. The method of claim 14, wherein the second current is provided such that the DC voltage across the photodiode is below 200 millivolts.

16. A circuit arrangement for a remote control receiver comprising:
    a plurality of photodiodes arranged as a series circuit, wherein said series circuit provides an output signal having a DC component and an AC component, and
    a controlled current source configured to provide a bias current to the series circuit based on the AC component.

17. The circuit arrangement of claim 16, wherein the controlled current source includes a bipolar transistor as a current regulator, and a junction field effect transistor as a controllable resistor.

18. The circuit of claim 16, wherein the series circuit includes a diode area on a chip or wafer that is split to provide the plurality of photodiodes.

19. The circuit arrangement of claim 16, wherein the photodiodes of the series circuit are substantially identical.

20. The circuit arrangement of claim 16, further comprising a transimpedance amplifier that is configured to detect the AC component.

* * * * *